United States Patent
Yoshida

[19]

[11] Patent Number: 6,130,584
[45] Date of Patent: Oct. 10, 2000

[54] OVER-SAMPLING TYPE CLOCK RECOVERY CIRCUIT WITH POWER CONSUMPTION REDUCED

[75] Inventor: Ichiro Yoshida, Tokyo, Japan

[73] Assignee: NEC Corporation, Tokyo, Japan

[21] Appl. No.: 09/266,885

[22] Filed: Mar. 12, 1999

[30] Foreign Application Priority Data

Mar. 12, 1998 [JP] Japan .................................. 10-061738

[51] Int. Cl.[7] ...................................................... H03L 7/00
[52] U.S. Cl. ...................... 331/11; 331/DIG. 2; 375/376; 327/149
[58] Field of Search ................................ 331/10, 11, 1 A, 331/DIG. 2; 327/148, 144, 149, 141; 375/374, 376

[56] References Cited

U.S. PATENT DOCUMENTS 5,633,899   5/1997   Fiedler et al. ........................... 375/376

FOREIGN PATENT DOCUMENTS

| 61-18274 | 5/1986 | Japan . |
|---|---|---|
| 61-145945 | 7/1986 | Japan . |
| 61-214842 | 9/1986 | Japan . |
| 3-069238 | 3/1991 | Japan . |
| 4-011431 | 1/1992 | Japan . |

OTHER PUBLICATIONS

Lee, et al.; "A 622Mb/s/CMOS Clock Recovery PLL with Time-Interleaved Phase Detector Array".

*Primary Examiner*—Robert Pascal
*Assistant Examiner*—Kimberly E Glenn
*Attorney, Agent, or Firm*—McGinn & Gibb, P.C.

[57] ABSTRACT

An over-sampling type clock recovery circuit includes a phase difference detecting section, a phase adjusting section and a signal selecting section. The phase difference detecting section detects a phase difference between a data signal and each of a plurality of active sets of clock signals, and generates a phase adjustment signal from a plurality of phase difference data corresponding to the detected phase differences using a majority determination. The phase adjusting section generates N (N is an integer equal to or larger than 2) sets of clock signals and adjusts phases of clock signals of the N sets based on the phase adjustment signal. The signal selecting section selects a part or all of the N sets of clock signals based on the detected phase differences from the phase difference detecting section. The selected sets of clock signals are supplied to the phase difference detecting section as the plurality of active sets of clock signals.

19 Claims, 10 Drawing Sheets

Fig. 2A PRIOR ART  data 
Fig. 2B PRIOR ART  $clk_{n-1}$ 
Fig. 2C PRIOR ART  $clk_n$ 
Fig. 2D PRIOR ART  $clk_{n+1}$ 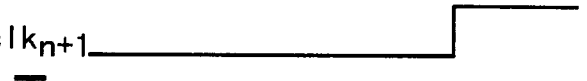
Fig. 2E PRIOR ART  up  disable
Fig. 2F PRIOR ART  dn  disable
LOCK STATE WITHOUT CLOCK PHASE SHIFT

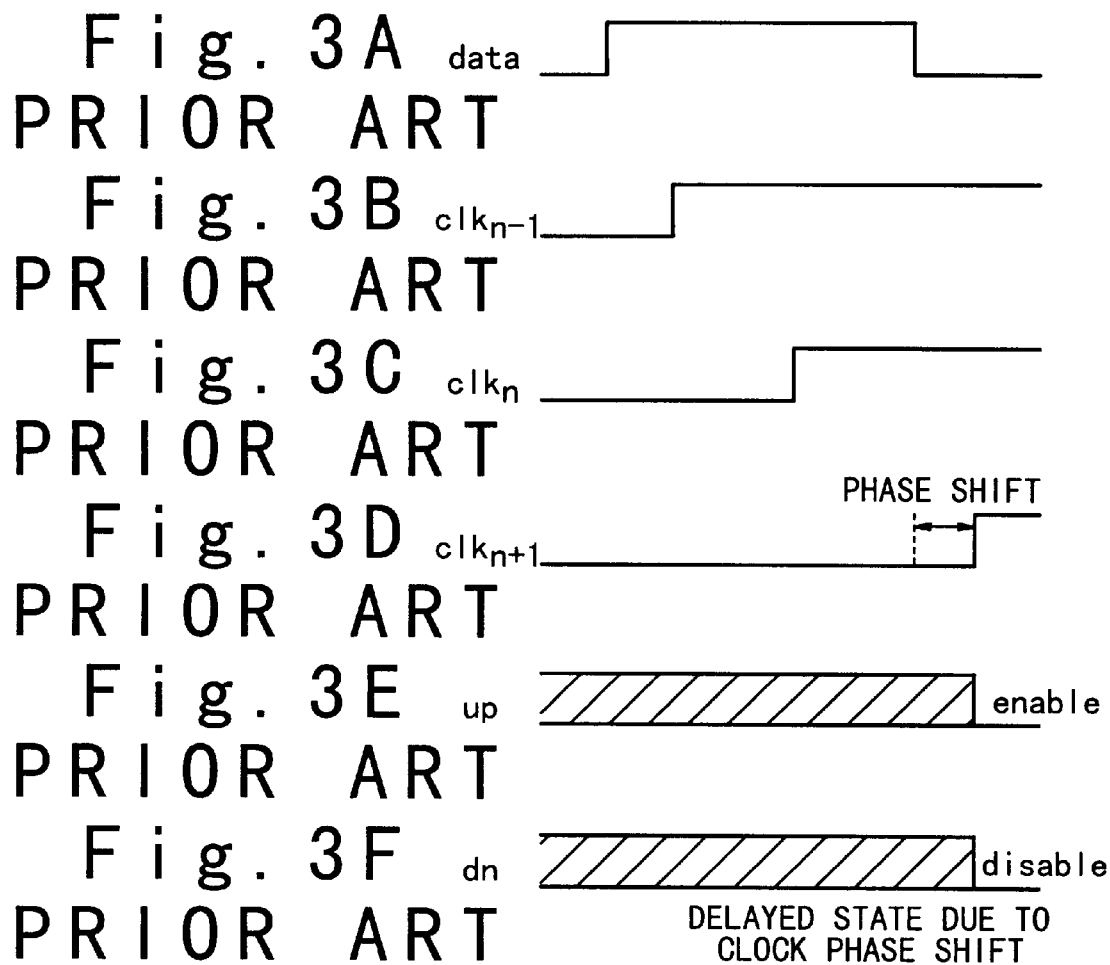

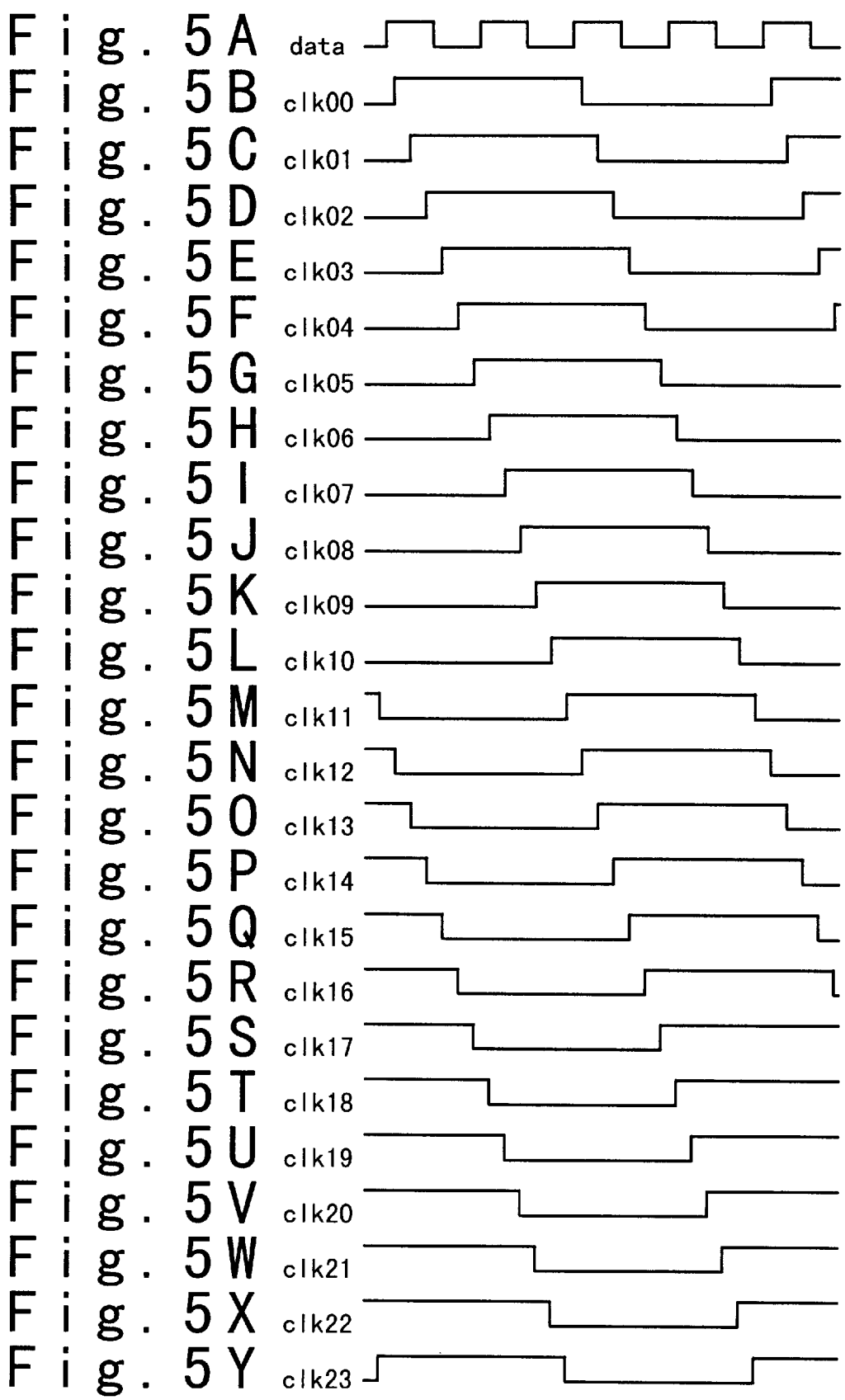

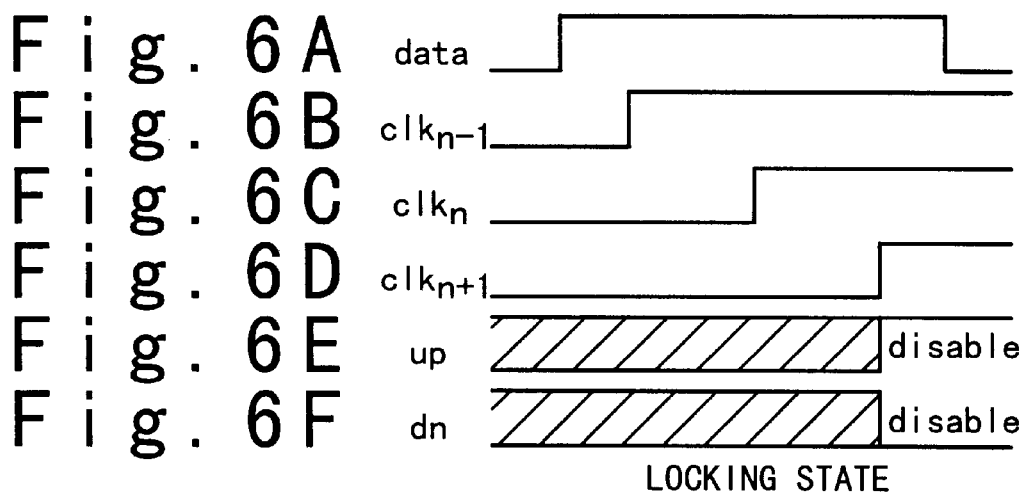
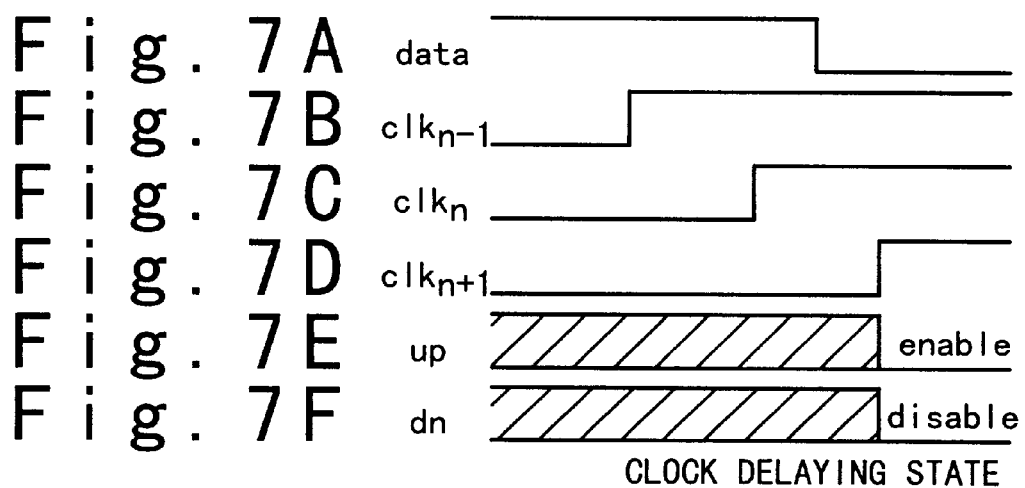
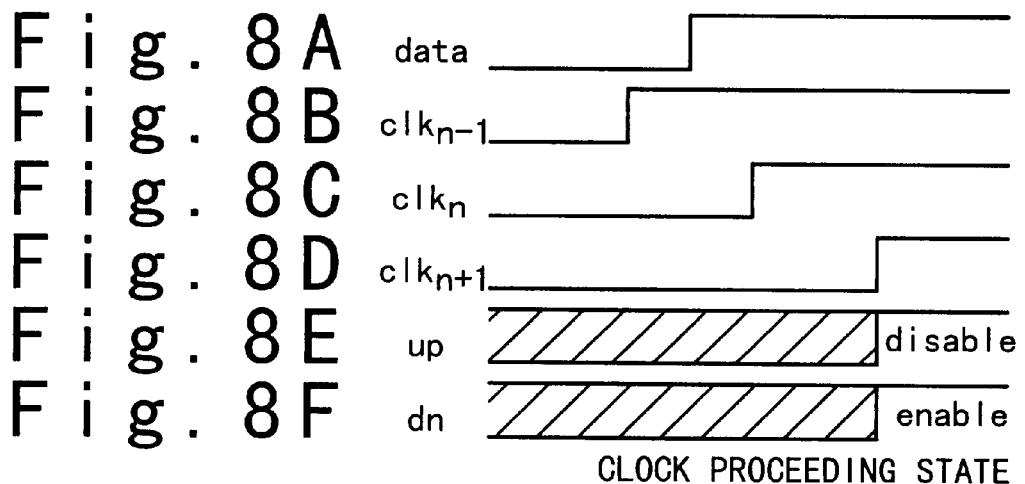

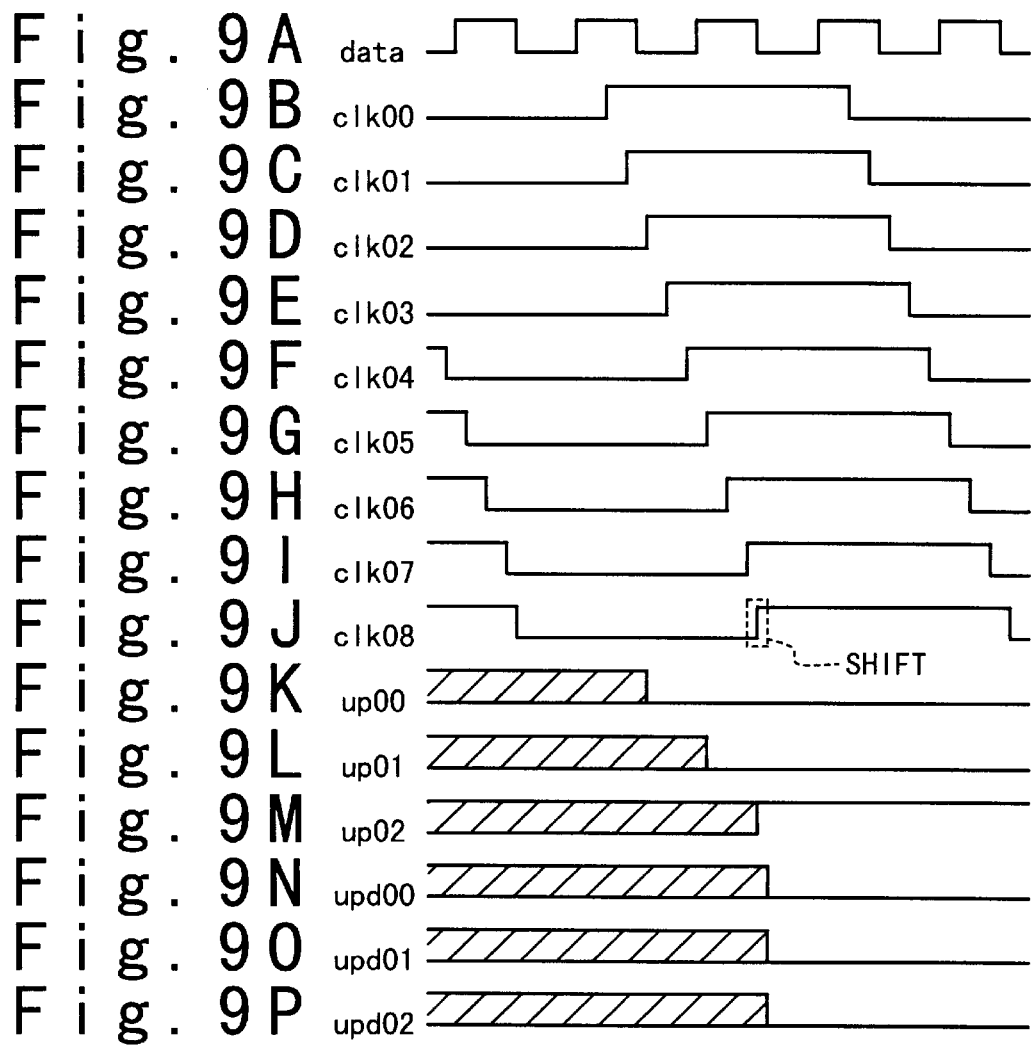

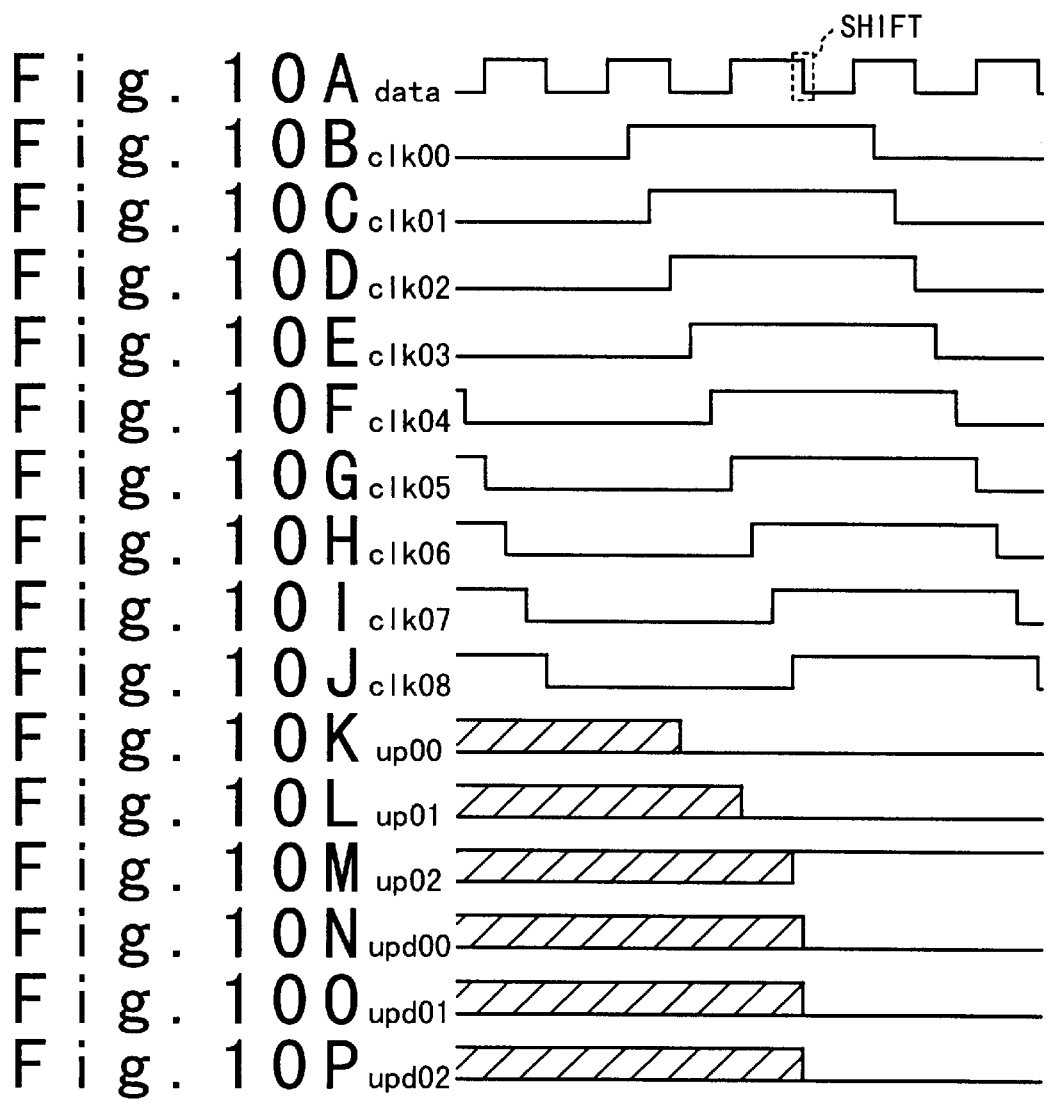

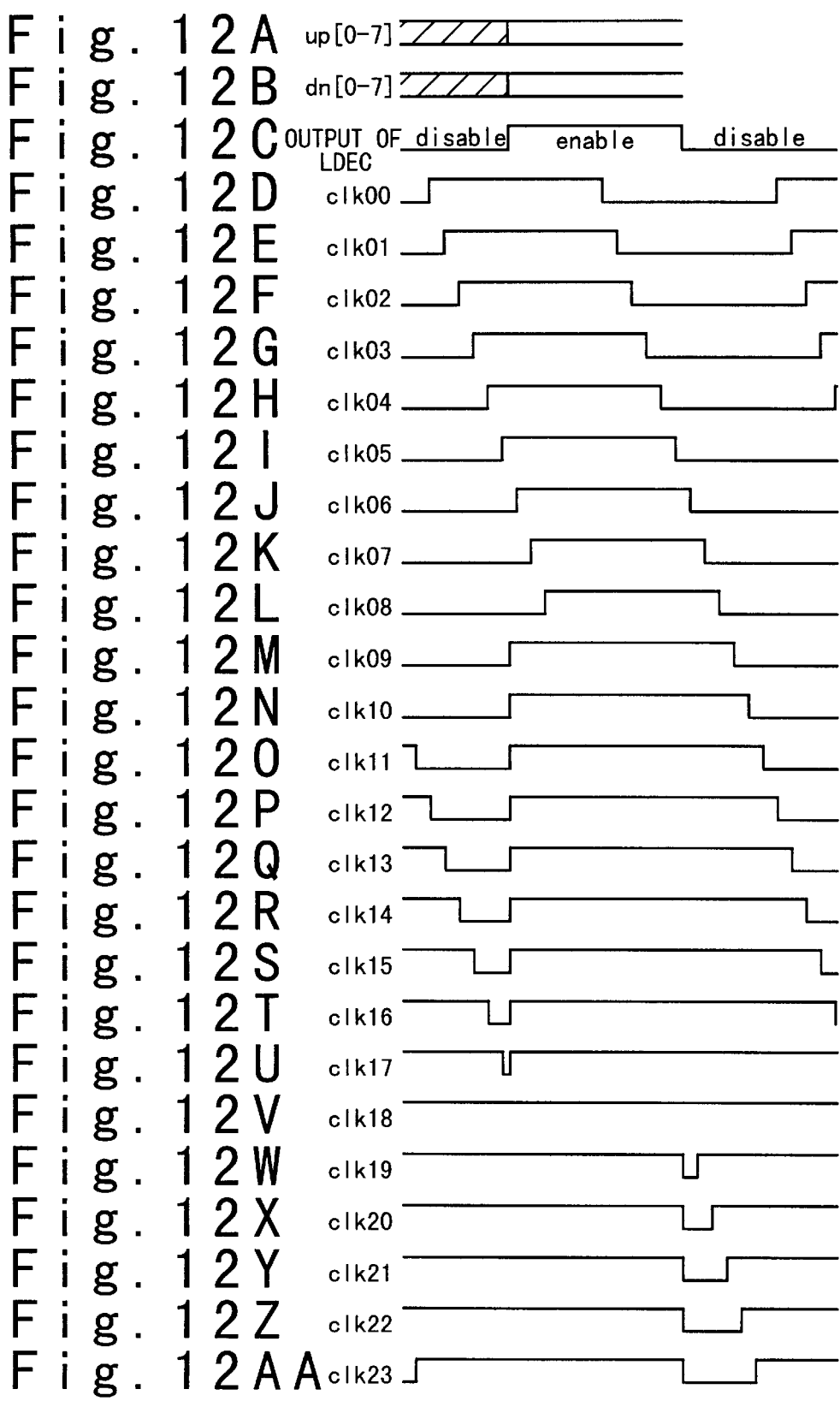

OVER-SAMPLING TYPE CLOCK RECOVERY CIRCUIT WITH POWER CONSUMPTION REDUCED

BACKGROUND OF THE INVENTION

1. Field of the Invention

The present invention relates to a clock recovery circuit, and more particularly, to an over-sampling type clock recovery circuit which performs sampling of a data signal based on a plurality of clock signals having different phases.

2. Description of the Related Art

In recent years, a high-speed protocol is proposed such as Gbit Ethernet and Fiber Channel for data transmission. For this purpose, high speed processing is requested in a clock recovery circuit to extract a clock signal from a data signal in a high speed transmission and in a PLL circuit to establish frequency synchronization between the clock signal used in the circuit and the transmitted clock signal. In order to respond to such a request, as disclosed in 1996 IEEE International Solid-State Circuits Conference, an over-sampling type clock recovery circuit is proposed in which the transmitted data signal is sampled based on a plurality of clock signals with different phases generated by an internal circuit.

FIG. 1 shows a circuit block diagram of a clock recovery circuit which is disclosed in the conventional example. A data signal is supplied to eight phase comparators TIPD0 to TIPD7. The respective phase comparators TIPD0 to TIPD7 are supplied with 24 clock signals having fixed delays outputted from a fixed delay circuit for every set of three clock signals.

Each phase comparator detects the phase state between the data signal and the set of three clock signals. When the set of clock signals and the data signal are matched in phase to each other, the phase comparator detects a locking state to set a corresponding one of up signals up0 to up7 to an disable state and a corresponding one of dn signals dn0 to dn7 to a disable state, as shown in FIGS. 2A to 2F. When the set of clock signals leads the data signal, the phase comparator detects the leading of the clock signals to set a corresponding one of up signals up0 to up7 to the disable state and a corresponding one of dn signals dn0 to dn7 to an enable state. Similarly, when detecting the delay of the clock signal compared to the data signal, the phase comparator sets the up signal to the enable state and the dn signal to the disable state, as shown in FIGS. 3A to 3F.

Charge pumps CP0 to CP7 increase the output voltages when the up signals are set to the enable state and decrease the output voltages decrease when the dn signal is set to the enable state. The output voltages are supplied to a low pass filter LPF. The low pass filter LPF integrates the changes of the voltages supplied from the charge pumps CP0 to CP7 and outputs the integrated voltage to a variable delay circuit VD. A voltage controlled oscillator VCO oscillates and generates a reference clock signal to output to the variable delay circuit VD. The variable delay circuit VD delays the reference clock signal from the voltage controlled oscillator VCO in accordance with the integrated voltage from the low pass filter LPF. Then, a fixed delay circuit FD receives the delayed clock signal from the variable delay circuit FD and generates the 24 clock signals having fixed delays from the delayed clock signal.

In the clock recovery circuit, the up signal or dn signal is set to the enable state in each phase comparator, as described above. As a result, the voltage outputted from the corresponding charge pump CP increases or decreases, when the leading or delaying state of the set of clock signals is detected. Therefore, the delayed clock signal is outputted from the variable delay circuit VD based on the phase leading or delaying state, and the 24 clock signals are generated by the fixed delay circuit FD based on the delayed clock signal. As a result, the leading or delaying state of the clock signals to be supplied to each of the phase comparators TIPD0 to TIPD7 is controlled so that the appropriate sampling of the data signal can be realized.

However, in this clock recovery circuit, the data sampling cannot be correctly performed, when the phase differences are generated between the 24 clock signals due, to the influence of the wiring layout of the circuit. Especially, when a phase difference is generated between three clocks supplied to the phase comparator, the data sampling cannot be correctly performed. For example, when delay of a clock signal clkn+1 is generated as shown in FIG. 3D, the phase comparator detects a clock delaying state so that the up signal is set to the enable state. For this reason, owing to the operation in the stage subsequent to the charge pump CP receiving the enable state of the up signal, the delay of the 24 clock signals generated in the fixed delay circuit FD is controlled. As a result, the correct data sampling cannot be performed in the whole clock recovery circuit, including other phase comparators.

Also, in such a clock recovery circuit, the number of bits of the transmitted data signal continuously having the same value is limited. Therefore, in a locking state in which any phase difference is not detected, even if the number of clock signals used for the sampling is decreased, the phase difference can be correctly detected.

However, in the above-mentioned clock recovery circuit, the eight phase comparators TIPD0 to TIPD7 are always in the operating state regardless of whether or not they are in the locking state. As the result, in the locking state, ones of the phase comparators other than the phase comparators necessary to detect phase differences perform unnecessary operation. Therefore, the eight phase comparators with the relatively large power consumption operate continuously at the same time. Thus, the power consumption as the whole clock recovery circuit cannot be ignored. Also, each of the charge pumps CP0 to CP7 subsequent to the phase comparators TIPD0 to TIPD7 operate based on phase difference data outputted from the respective phase comparators. Moreover, the power consumption in the low pass filter LPF and the subsequent circuits cannot be ignored.

In addition to the above conventional example, a disqueque apparatus is disclosed in Japanese Examined Patent Application (JP-B-Showa 61-18274). In this reference, the disqueque apparatus is composed of first and second sections and a memory section. The first section determines a majority of sync signals for channels to produce a signal. The second section produces a synthetic signal in response to an output obtained by adding clocks for the channels. The memory section executes performs a read operation in response to the signal and the synthetic signal. Thus, when a data block is composed of a plurality of tracks each of which includes a frame sync signal and a data, the disqueque apparatus can remove a time shift of data between the tracks in a multi-track digital magnetic recording and reproducing apparatus.

Also, a digital signal receiving apparatus is disclosed in Japanese Laid Open Patent application (JP-A-Showa 61-145945). In this reference, the digital signal receiving apparatus is composed of a reproducing section and a majority determining section and a conversion section. The reproducing section reproduces clock signals having a basic clock signal frequency fr and a frequency n (n is a positive integer equal to or larger then 3) times of the basic clock signal frequency fr locked to a digital reproduction signal in phase. The majority determining section extracts n samples values during one bit of the digital reproduction signal based on nfr clock signals, and determines binary values of the n sample values on the majority side as a value during the bit. The converting section converts the determined value to have 1/fr width. Thus, the digital reproduction signal is shaped in units of basic clocks fr of the digital reproduction signal.

Also, a data sampling converting circuit is disclosed in Japanese Laid Open Patent application (JP-A-Showa 61-214842). In this reference, the data sampling converting circuit includes a clock reproducing circuit, a frequency dividing circuit and a determining circuit. The clock reproducing circuit reproduces a clock pulse from a character multiplexed signal. The frequency dividing circuit divides the reproduced clock signal in frequency to 1 to n-th, and generates n sampling pulses with different phases. The determining circuit performs sampling of the character multiplexed signal with the n sampling pulses and determines based on majority determination of m continuous sampling results whether a digital data is in a high level or a low level.

Also, a demodulation data identifying and determining apparatus is disclosed in Japanese Laid Open Patent application (JP-A-Heisei 3-69238). In this reference, the demodulation data identifying and determining apparatus is composed of a detecting and demodulating circuit, a comparator, a clock reproducing circuit, a timing determining section, a latch circuit. The detecting and demodulating circuit demodulate an input signal to output a base band signal. The comparator converts the base band signal into a binary signal. The clock reproducing circuit reproduces a reproduction clock signal having the same frequency as a bit rate of a transmission data, and generates a clock signal faster than the reproduction clock signal. The timing determining section performs sampling of the binary signal using the clock signal and performs majority determination to a plurality of values corresponding to a plurality of sampling points to output the result of the majority determination. The latch circuit latches the output from the timing determining section in accordance with the reproduction clock signal to output as a reproduced digital data.

Also, a digital signal reproducing circuit is disclosed in Japanese Laid Open Patent application (JP-A-Heisei 4-11431). In this reference, the digital signal reproducing circuit is composed of a demodulating section, a sampling section and a majority determining section. The demodulating section demodulates a digital modulated signal. The sampling section performs sampling of the demodulated digital signal in accordance with clock signals from a clock source. The majority determining section performs majority determination to a plurality of sampling values supplied from the sampling section.

SUMMARY OF THE INVENTION

An object of the present invention is to provide an over-sampling type clock recovery circuit which can correct phase differences between a plurality of clock signals used for sampling of an input data signal.

Another object of the present invention is to provide an over-sampling type clock recovery circuit in which an unnecessary operation in each of the sections of the circuit is stopped in a locking state so that power consumption can be reduced.

In order to achieve a first aspect of the present invention, an over-sampling type clock recovery circuit includes a phase difference detecting section, a phase adjusting section and a signal selecting section. The phase difference detecting section detects a phase difference between a data signal and each of a plurality of active sets of clock signals, and generates a phase adjustment signal from a plurality of phase difference data corresponding to the detected phase differences using a majority determination approach. The phase adjusting section generates N (N is an integer equal to or larger than 2) sets of clock signals and adjusts phases of clock signals of the N sets based on the phase adjustment signal. The signal selecting section selects a part or all of the N sets of clock signals based on the detected phase differences from the phase difference detecting section and supplies the selected sets of clock signals to the phase difference detecting section as the plurality of active sets of clock signals.

The phase adjusting section may include an oscillator for generating a reference clock signal, a delay unit for delaying the reference clock signal based on the phase adjustment signal, and a clock signal generating section for generating the N sets of clock signals from the delayed reference signal such that each of the plurality of clock signals has a predetermined delay.

Also, the phase difference detecting section may include a N phase comparators, a majority determining circuit and an adjustment signal generating section. The plurality of active sets of clock signals are supplied to selected N phase comparators. Each of the selected phase comparators compares a corresponding one of bits of the data signal and a corresponding one of the plurality of active sets of clock signals in phase to detect the phase difference. The majority determining circuit determines majority of the phase differences and changing ones of the phase differences on a minority side to match to ones of the phase differences on a majority side to generate the plurality of phase difference data. The adjustment signal generating section generates the phase adjustment signal from the plurality of phase difference data from the majority determining circuit. In this case, non-selected phase comparators of the N phase comparators other than the selected phase comparators stop their operations to reduce power consumption. Also, a portion of the adjustment signal generating section corresponding to the non-selected phase comparators stops its operation to reduce power consumption.

Also, each of the selected phase comparators detects one of a clock leading state, a clock locking state and a clock delaying state to generate one of a clock leading state signal, a clock locking state signal and a clock delaying state signal. A corresponding one of the plurality of active sets of clock signals leads the data signal in the clock leading state, the corresponding active set of clock signals matches the data signal in phase in the clock locking state, and the corresponding active set of clock signals lags the data signal in phase in the clock delaying state. The majority determining circuit determines the majority of the clock leading state signals and the clock delaying state signals for the N phase comparators, and corrects one of the clock leading state signals and the clock delaying state signals on a minority side to the other on a majority side to generate the plurality of phase difference data.

The part of the N sets of clock signals is predetermined.

The signal selecting section selects all of the N sets of clock signals when any one of the plurality of phase difference data indicates that the data signal and a corresponding one of the plurality of active sets of clock signals are not matched to each other in phase, and the part of the N sets of clock signals when all of the phase differences indicate that the data signal and a corresponding one of the plurality of active sets of clock signals are matched to each other in phase.

Also, the signal selecting section may include a locking state detecting circuit and a switch circuit. The locking state detecting circuit determines based on the plurality of phase difference data supplied from the phase difference detecting section whether the data signal and each of the plurality of active sets of clock signals are matched to each other in phase. The switch circuit supplies all of the N sets of clock signals to the phase difference detecting section as the plurality of active sets of clock signals, when the locking state detecting circuit detects that the data signal and at least one of the plurality of active sets of clock signals are not matched to each other in phase. In this case, the switch circuit fixes the clock signals of non-selected sets as ones of the N sets other than the selected sets to a high or low level, when the locking state detecting circuit detects that the data signal and each of the plurality of active sets of clock signals are not matched to each other in phase, and supplies the selected sets of clock signals and the non-selected sets of clock signals to the phase difference detecting section.

In order to achieve another aspect of the present invention, a method of adjusting phases of clock signals in an over-sampling type clock recovery circuit includes:

detecting a phase difference between a data signal and each of a plurality of active sets of clock signals, to generate a phase adjustment signal from a plurality of phase difference data corresponding to the detected phase differences using a majority determination;

adjusting phases of clock signals of N (N is an integer equal to or larger than 2) sets based on the phase adjustment signal; and selecting a part or all of the N sets of clock signals as the plurality of active sets of clock signals based on the plurality of phase difference data from the phase difference detecting section.

BRIEF DESCRIPTION OF THE DRAWINGS

FIG. 2A to 2F are timing charts illustrating a data signal, clock signals and phase difference data in a locking state;

FIG. 3A to 3F are timing charts illustrating a data signal, clock signals and phase difference data in a clock delaying state;

FIGS. 5A to 5Y are timing charts illustrating a data signal and clock signals;

FIGS. 6A to 6F are timing charts to explain an operation of a phase comparator in a locking state;

FIGS. 7A to 7F are timing charts to explain an operation of the phase comparator in a clock delaying state;

FIGS. 8A to 8F are timing charts to explain an operation of the phase comparator in a clock leading state;

FIGS. 9A to 9P are timing charts to explain a first operation of the phase comparator;

FIGS. 10A to 10P are timing charts to explain a second operation of the phase comparator;

FIGS. 12A to 12AA are timing charts to explain an operation of a switch circuit in response to the output of a locking state detecting circuit.

DESCRIPTION OF THE PREFERRED EMBODIMENTS

Next, an over-sampling type clock recovery circuit of the present invention will be described below in detail with reference to the accompanied drawings.

Figure 1:
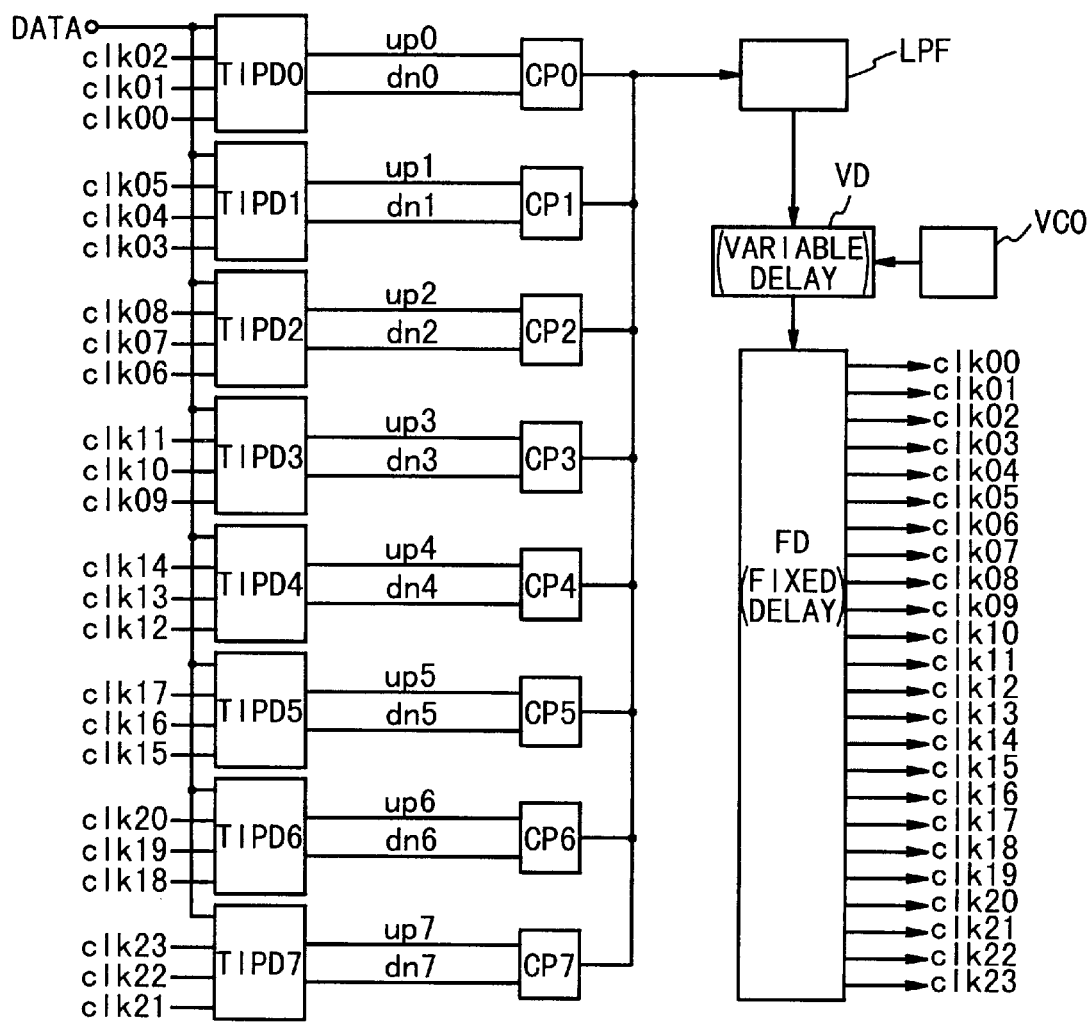
FIG. 1 is a block diagram illustrating the structure of an example of a conventional clock recovery circuit.
Figure 4:
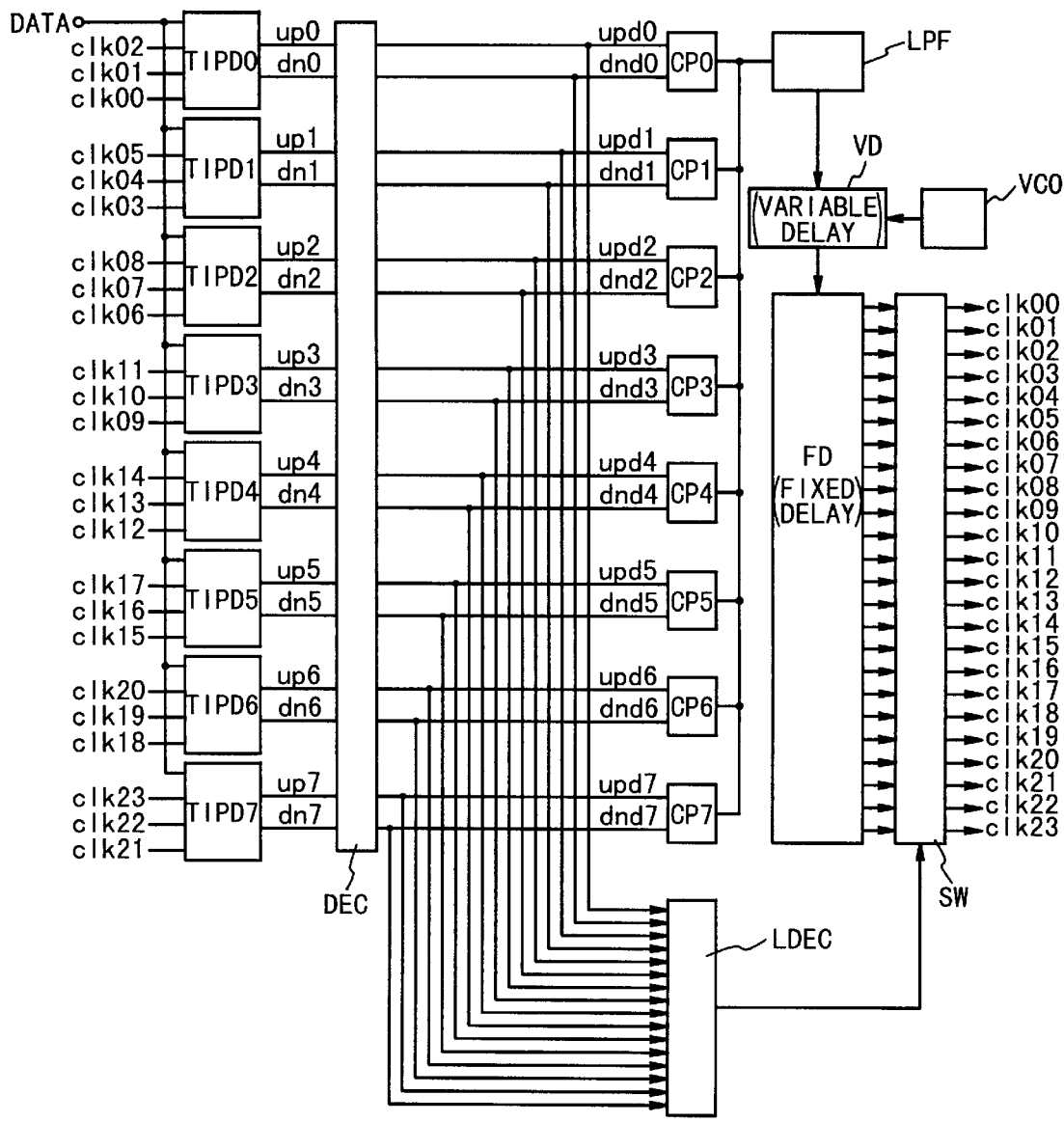
FIG. 4 is a circuit block diagram showing the structure of a clock recovery circuit according to an embodiment of the present invention.

FIG. 4 is a block circuit diagram illustrating the structure of the over-sampling type clock recovery circuit according to an embodiment of the present invention. The over-sampling type clock recovery circuit is composed of a plurality of phase comparators TIPD0 to TIPD7, a majority determining circuit DEC, a plurality of charge pumps CP0 to CP7, a low pass filter LPF, a voltage controlled oscillator VCO, a variable delay circuit VD, a fixed delay circuit FD, a locking state detecting circuit LDEC, and a switch circuit SW. It should be noted that the same reference symbols are allocated to the same components as those of the conventional clock recovery circuit.

In the embodiment, each of eight phase comparators TIPD0 to TIPD7 is provided to perform sampling of a data signal of 8 bits with three clock signals. That is, each of the phase comparators TIPD0 to TIPD7 inputs the 3 clock signals having fixed delays and the data signal transmitted thereto and detects the phase state between the data signal and the clock signals. When the data signal lags the clock signal, the phase comparator detects the leading of the clock signal to the data signal to set a corresponding one of up signals up0 to up7 to an disable state and to set a corresponding one of dn signals dn0 to dn7 to an enable state. In the same way, when detecting the clock signals lags the data signal, the phase comparator sets the corresponding up signal to the enable state and the corresponding dn signal to the disable state.

FIGS. 6A to 6F show a locking state in which the phases of the data signal and the clock signals are coincident with each other in phase. FIGS. 7A to 7F show the clock delaying state in which the data signal leads the clock signals. When the data signal leads the clock signals, the phase comparator detects the clock delaying state to set an up signal of the phase difference data to an enable state and to set a dn signal of the phase difference data to a disable state. FIGS. 8A to 8F show the clock leading state in which the data signal delays lags the clock signals. When the data signal delays lags the clock signals, the phase comparator detects the clock leading state to set the up signal to a disable state and to set the dn signal to an enable state.

The majority determining circuit DEC is connected with the output terminals of the respective phase comparators TIPD0 to TIPD7. The majority determining circuit DEC determines the majority of the up or dn signals of the enable state from the phase comparators TIPD0 to TIPD7 to determine whether the clock signals leads in phase than the data signal as the whole circuit. As the result of the majority determination, the states of the up signals and dn signals on the minority side are corrected to match those of the up signals and dn signals on the majority side. Then, the majority determining circuit DEC outputs the upd signals and dnd signals on the majority side and the corrected up signals and dn signals on the minority side to the charge pumps CP0 to CP7 and the locking state detecting circuit LDEC as upd signals and dnd signals, respectively.

The respective charge pumps CP0 to CP7 and the single locking state detecting circuit LDEC are connected to the output terminals of the upd signals and the dnd signals of the phase comparators TIPD in parallel. The locking state detecting circuit LDEC recognizes the locking state of each phase comparator from the states of the upd signal and the dnd signal outputted from the majority determining circuit DEC, and detects whether all the phase comparators, i.e. the whole circuit is set to the locking state. Then, the locking state detecting circuit LDEC outputs to the switch circuit SW, a locking state detection signal switched between the enable state and the disable state based on the detection result of the locking state.

Each of the charge pumps CP inputs corresponding ones of the upd signals and dnd signals from the majority determining circuit DEC and changes the output voltage in accordance with the input signals to outputs to the low pass filter LPF. The low pass filter LPF integrates the changes of the output voltages from the charge pumps CP0 to CP7 to output to the variable delay circuit VD. The variable delay circuit VD inputs a reference clock signal having a predetermined frequency supplied from the voltage controlled oscillator VCO and the output of the low pass filter LPF. The variable delay circuit VD delays the reference clock signal in accordance with the output voltage from the low pass filter LPF. Moreover, the fixed delay circuit FD inputs the output of the variable delay circuit VD, and generates 24 clock signals having fixed delays from the inputted clock signal. The 24 clock signals are supplied to the phase comparators TIPD0 to TIPD7 in sets of three, through the switch circuit SW.

Moreover, the switch circuit SW is connected to the output terminals of the fixed delay circuit FD for the 24 clock signals such that the level of each clock signal is selectively set to a high level or a low level, to the high level in this example.

When a locking state detection signal supplied from the locking state detecting circuit LDEC indicates the locking states of the phase comparators, the switch circuit SW fixes predetermined ones of the 24 clock signals clk00 to clk23 as selected clock signals to the high level. In this case, the clock signals fixed to the high level are predetermined in units of sets of three clock signals to be supplied to the phase comparator. Therefore, only the clock signals supplied to the selected ones of the phase comparators TIPD0 to TIPD7 are fixed to the high level. Non-selected clock signals of the 24 clock signals other than the selected clock signals are supplied, as they are, to non-selected ones of the phase comparators TIPD0 to TIPD7 other than the selected phase comparators through the switch circuit SW.

The operation of the clock recovery circuit having the above-mentioned structure will be described. FIG. 5A to 5Y are time charts to explain the data signal supplied to the eight phase comparators TIPD0 to TIPD7 and the 24 clock signals used to perform sampling of the data signal. Also, FIGS. 6A to 6F, 7A to 7F, and 8A to 8F are timing charts to explain the operation of the each of the phase comparators TIPD0 to TIPD7. As described in the conventional example, each phase comparator detects the phase state between the data signal and corresponding set of three $clk_{n-1}$, $clk_n$, and $clk_{n+1}$ of the 24 clock signals.

FIGS. 6A to 6F show a locking state in which the phases between the data signal and the clock signals are coincident with each other. Since there is no need to change the phases of the clock signals in the locking state, both of the up signal and the dn signal are set to the disable state, as shown in FIGS. 6E and 6F.

FIGS. 7A to 7F show the leading state of the data signal to the clock signals in phase. When the clock signals delay than the data signal, the up signal is set to the enable state as shown in FIG. 7E and the dn signal is set to the disable state as shown in 7F. As a result, the phases of the clock signal are led.

FIGS. 8A to 8F show the delay state of the data signal than the clock signals. When the clock signals lead than the data signal, the up signal is set to the disable state as shown in FIG. 8E and the dn signal is set to the enable state as shown in FIG. 8F. As a result, the phases of the clock signals are delayed.

Then, the up signal and dn signal of each phase comparator are supplied to the majority determining circuit DEC. The majority determining circuit DEC inputs the up signals and dn signals supplied from the respective phase comparators TIPD0 to TIPD7. The majority determining circuit DEC determines the majority of the detecting results of the respective phase comparators TIPD0 to TIPD7 based on the supplied up signals and dn signals.

As described above, in the over-sampling type clock recovery circuit, sampling of the data signal with the clock signals having the fixed phase differences. Therefore, if the data signal is not to be high or low continuously, the phase difference data detected in each phase comparator becomes the same value even though there is any delay due to the phase difference of the clock signals. When the data signal is high or low continuously, there is no rising edge in the data signal. Therefore, the phase comparator determines that the data signal is in the locking state and sets the up signal and dn signal to the disable state. However, because there is a limitation of the number of data bits continuously having the same value depending upon a transmission system, the phase of the data signal can be necessarily detected in a certain bit unit. Therefore, in this embodiment, the data in units of 8 bits is used.

From the result of the majority determination of the number of up signals or dn signals set to the enable state or disable state, it is determined whether the clock signals in the circuit leads to or delays than the data signal as the whole clock recovery circuit.

FIGS. 9A to 9P show the data signal and the clock signals clk00 to clk08, the up signals up01 to up02 outputted from the phase comparators TIPD0 to TIPD2 supplied, and the upd signals upd00 to upd02 corrected by the majority determining circuit DEC. In the state shown in FIGS. 9A to 9P, if there is not a phase shift in each clock signal, the clock signals are detected by all the phase comparators TIPD0 to TIPD7 to be in the phase delay state. As a result, the up signals are set to the enable state, and the dn signals are set to the disable state.

However, because there is a phase shift, i.e., the phase leading (proceeding) in the clock signal clk08 of FIG. 9J, the phase comparator TIPD2 supplied with the clock signals clk06 to clk08 determines to be in the locking state. Therefore, the phase comparator TIPD2 sets the up signal to the disable state, as shown in FIG. 9M, and the dn signal to the disable state. However, when the up signals are inputted from all the phase comparators TIPD0 to TIPD7 shown in FIG. 4, the majority determining circuit DEC determines the majority of the up signals and the dn signals. Therefore, the majority determining circuit DEC determines that the clock recovery circuit is in the phase delay state of the clock signals as the whole circuit. Thus, the upd02 signal as the output signal of the majority determining circuit DEC corresponding to the up02 signal is set to the enable state.

Therefore, in the operation since then, an influence due to the phase shift of the clock signal clk08 is canceled.

FIGS. 10A to 10P show timing charts of the data signal, the clock signals clk00 to clk08, the up signals up0 to up2, and upd signal upd00 to upd02. Here, a case is shown where a phase shift of the data signal occurs at a certain bit to delay the phase of the data signal. When the phase shift occurs in the bit of the data signal, the majority determining circuit DEC could correct the phase shift, as in the above case where the clock signal is shifted in phase. That is, if there is not a phase shift in the bit of the data signal, the clock delaying state of the clock signals is detected by the phase comparators TIPD0 and TIPD1. Therefore, the up signals up01 and up02 are set to the enable state. However, in this case, because there is a phase delay sift in the third bit of the data signal, the phase comparator TIPD2 inputting the third bit determines to be in locking state and sets the up signal to the disable state and the dn signal to the disable state. The majority determining circuit DEC determines the majority of the up signals and the dn signals outputted from all the phase comparators TIPD0 to TIPD7 shown in FIG. 4. Therefore, the majority determining circuit DEC determines that the clock signal delays than the data signal as the whole circuit. As a result, the majority determining circuit DEC sets the upd signal upd02 corresponding to the up02 signal outputted from the phase comparator TIPD2 to the enable state and the dnd signal dnd02 to the disable state. Therefore, in the operation since then, an influence due to the phase shift of the data signal is canceled.

Figure 11:
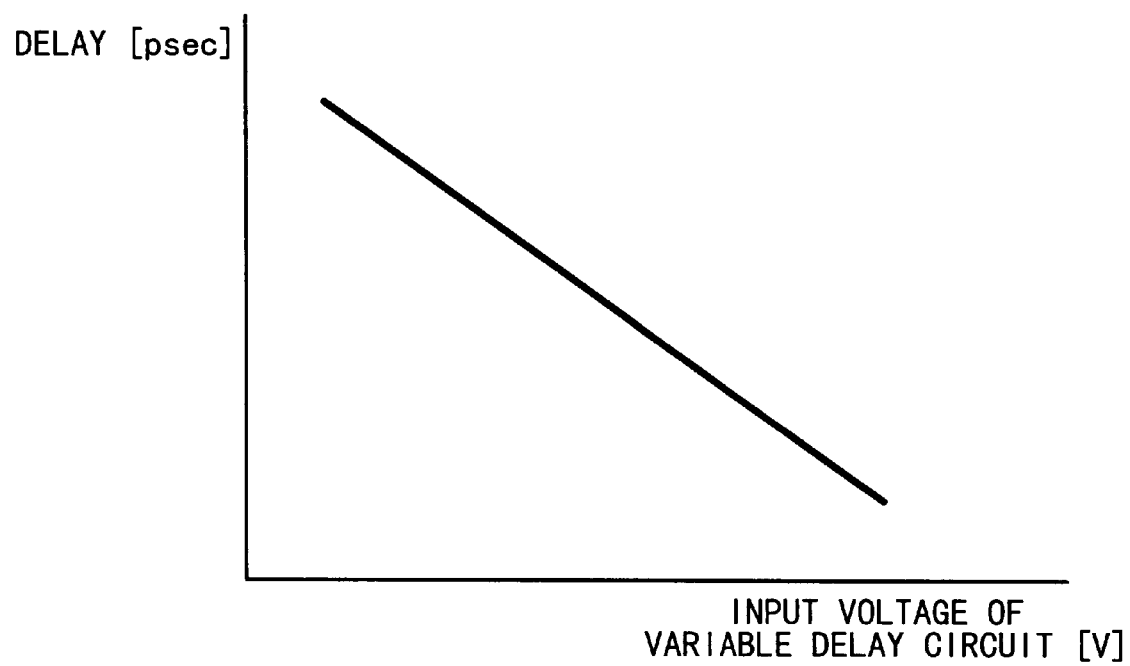
FIG. 11 is a diagram illustrating the input-output characteristic of a variable delay circuit.

In this way, the phase shift of the clock signal or data signal is corrected by the majority determining circuit DEC. Therefore, the respective charge pumps CP0 to CP7 supplied with the upd signals upd0 to upd7 and dnd signals dnd0 to dnd7, converts the phase difference data obtained from the upd signals and dnd signals into the voltage values. That is, when the upd signal is set to the enable state, the output voltage is increased, and when the dnd signal is set to the enable state, the output is decreased. The low pass filter LPF is supplied with the output voltages of the charge pumps PC0 to PC7 and integrates the change of this voltage. The variable delay circuit VD is supplied with the output voltage of the low pass filter LPF and the reference clock signal outputted from the voltage controlled oscillator VCO. The variable delay circuit VD delays and outputs the reference clock signal in accordance with the output voltage of the low pass filter LPF. FIG. 11 shows relation of a delay quantity to the input voltage of the variable delay circuit VD. The reference clock signal delayed by the variable delay circuit VD is supplied to the fixed delay circuit FD. Then, the fixed delay circuit generates the 24 clock signals having the same phase difference between the clock signals from the delayed reference clock signal, to output the clock signals to each of the phase comparator.

Therefore, when a phase shift is generated in a part of the clock signals having the fixed phases, or when the phase shift is generated in a part of the data signal, the majority determining circuit DEC corrects the phase differences detected by the phase comparators, even though the erroneous phase difference is outputted from a part of the phase comparators TIPD0 to TIPD7. Therefore, it is possible to avoid the generation of inappropriate leading or delay of the clock signals in the fixed delay circuit FD owing to the erroneous phase difference, resulting in the correct sampling of the data signal.

On the other hand, the locking state detecting circuit LDEC inputs the upd signals and the dnd signals as the phase difference data from the majority determining circuit DEC. The locking state detecting circuit LDEC recognizes the detection results of the respective phase comparators TIPD0 to TIPD7 based on the upd signals and the dnd signals, that is, the respective phase states indicated by the corrected phase difference data. Then, when all the upd signals and all the dnd signals are set to the disable, in other words, the locking states are detected, the locking state detecting circuit LDEC outputs a locking state indication signal set to an enable state to the switch circuit SW. It should be noted that when at least one of the upd signals and dnd signals outputted from the majority determining circuit DEC is set to the enable state, i.e., in a non-locking state, the locking state detecting circuit LDEC outputs a locking state indication signal set to a disable state.

FIGS. 12A to 12AA show timing charts to explain the operation of the switch circuit SW based on the enable state and the disable state of the locking state indication signal from the locking state detecting circuit LDEC. When the non-locking state is detected by the locking state detecting circuit LDEC, the switch circuit SW supplies all of the 24 clocks supplied from the fixed delay circuit FD to the respective phase comparators TIPD0 to TIPD7 in response to the locking state indication signal of the disable state. On the other hand, when the locking state detecting circuit LDEC detects the locking states of all the phase comparators, the switch circuit SW sends only the selected ones of the 24 clock signals to selected ones of the phase comparators TIPD0 to TIPD7, just as they are, in response to the locking state indication signal of the enable state. The switch circuit SW fixes the non-selected clock signals to the high state. In the example shown in FIGS. 12A to 12AA, the switch circuit SW supplies 24 clock signals clk00 to clk23 to the phase comparators TIPD0 to TIPD7 in case of the locking state. However, the switch circuit SW fixes the 15 clock signals clk09 to clk23 other than the clock signals clk00 to clk23 to the high level and supplies them to the phase comparators TIPD3 to TIPD7, respectively. That is, these phase comparators TIPD3 to TIPD7 are set to the states equivalent to the state in which any clock signal is not supplied.

Generally, the number of data bits of the transmitted data signal which continuously have the same value is defined depending upon the transmission system. Therefore, even if the number of clock signals used for sampling in the locking state is reduced, the detection of the phase difference is normally performed. The phase comparators TIPD0 to TIPD2 to which the clock signals clk00 to clk09 are supplied in the locking state performs the phase detection as in the non-locking state.

When any clock signal is not supplied, the phase comparator does not perform the phase difference detecting operation and the phase comparator TIPD maintains the locking state regardless of the phase difference between the data signal and the clock signals. As shown in FIGS. 7A to 8F, the phase comparator needs the change point (the edge) of the clock signals supplied for the sampling of the data signal. Therefore, when the clock signals supplied to the phase comparator are fixed to the high or low level so that the phase comparator is set to the state equivalent to the state in which any clock signal is not supplied, the phase difference detecting operation of the phase comparator can be restrained. Therefore, the phase comparators TIPD3 to TIPD7 are set to the state in which the phase detecting operation is stopped so that power consumption can be reduced. It should be noted that when the clock leading or delaying state is detected in the phase detecting operation by either one or all of the phase comparators TIPD0 to TIPD3 performing the phase difference detecting operation, the switch circuit SW again supplies all the clock signals which are not fixed to the high level, to the respective phase comparators TIPD0 to TIPD7. This is because the locking state detecting circuit LDEC outputs the locking state indication signal of the disable state. This is performed until all the phase comparators TIPD0 to TIPD7 are set to the locking state again.

In this way, the locking stated of the phase comparators are detected by the locking state detecting circuit LDEC. In the non-locking state, all the clock signals generated by the fixed delay circuit FD are supplied to the phase comparators TIPD0 to TIPD7, whereas, only the selected ones of the clock signals are supplied to the selected ones of the phase comparators in the locking state. Thus, in the locking state, the operations of the selected phase comparators are set to the stopped state. Also, the charge pumps connected with the selected phase comparators are set to the state in which the operations are set to the stopped state. Therefore, it is possible to decrease the power consumption of the whole clock recovery circuit in the locking state. The total power consumption of the whole circuit can be reduced.

It should be noted that the embodiment shows an example of the present invention only. The locking state detecting circuit LDEC may input the phase differences outputted from the respective phase comparators TIPD0 to TIPD7 before they are inputted to the majority determining circuit DEC. In this case, the locking states are detected based on the phase differences outputted from the respective phase comparators TIPD0 to TIPD7. Also, it is possible to suitably set the number of clock signals to be fixed to the high level in the locking state and the number of phase comparators. Also, in the locking state, the selected clock signals may be fixed to the low level. Further, it would not need to say that the number of bits of the data signal and the number of phase comparators associated with this number of bits of the data signal and the number of clock signals having the fixed phases used for phase comparison can be set suitably in accordance with the required speed.

As described above, according to the present invention, a majority determining circuit DEC is provided to input a plurality of phase difference data which are the outputs from a plurality of phase comparators TIPD0 to TIPD7. Also, the majority determining circuit DEC determines the majority of the phase difference data, and to correct and output the phase difference data on the minority side to the phase difference data on the majority side. Therefore, even if phase shifts of the plurality of the clock signals or the phase shift of the data signal are generated due to the influence of the layout, the phase difference data on the minority side generated from this phase difference can be corrected to the phase difference data on the majority side.

As described above, in the present invention, the locking state of each phase comparator is detected by the locking state detecting circuit based on the phase difference data between the data signal and the clock signals outputted from the plurality of phase comparators. In the non-locking state, all clock signals are supplied to the respective phase comparators. In the locking state, the selected clock signals are fixed to the high level or the low level and the selected clock signals are supplied to only the selected phase comparators. Therefore, in the locking state, the operations of the selected phase comparators are set to the stopped state. Also, the circuit elements connected with the phase comparators are set to the state in which the operations are set to the stopped state. Therefore, it is possible to reduce the power consumption of the whole clock recovery circuit in the locking state. The total power consumption of the whole circuit can be reduced.

What is claimed is:

1. An over-sampling type clock recovery circuit comprising:

a phase difference detecting section for detecting a phase difference between a data signal and each of a plurality of active sets of clock signals, and for generating a phase adjustment signal from a plurality of phase difference data corresponding to the detected phase differences using a majority determination;

a phase adjusting section for generating N (N is an integer equal to or larger than 2) sets of clock signals and for adjusting phases of clock signals of said N sets based on said phase adjustment signal; and a signal selecting section for selecting a part or all of said N sets of clock signals based on the detected phase differences from said phase difference detecting section and for supplying the selected sets of clock signals to said phase difference detecting section as said plurality of active sets of clock signals.

2. An over-sampling type clock recovery circuit according to claim 1, wherein said phase adjusting section includes:

an oscillator for generating a reference clock signal;

a delay unit for delaying said reference clock signal based on said phase adjustment signal; and a clock signal generating section for generating said N sets of clock signals from said delayed reference signal such that each of said plurality of clock signals has a predetermined delay.

3. The over-sampling type clock recovery circuit according to claim 1, wherein said phase difference detecting section includes:

N phase comparators, wherein said plurality of active sets of clock signals are supplied to selected ones of said N phase comparators, and each of said selected phase comparators compares a corresponding one of bits of said data signal and a corresponding one of said plurality of active sets of clock signals in phase to detect the phase difference;

a majority determining circuit for determining majority of said phase differences and changing ones of said phase differences on a minority side to match to ones of said phase differences on a majority side to generate said plurality of phase difference data; and an adjustment signal generating section for generating said phase adjustment signal from said plurality of phase difference data from said majority determining circuit, wherein said N phase comparators are selected by said signal selecting section.

4. The over-sampling type clock recovery circuit according to claim 3, wherein non-selected phase comparators of said N phase comparators stop their operations to reduce power consumption.

5. The over-sampling type clock recovery circuit according to claim 4, wherein a portion of said adjustment signal generating section corresponding to said non-selected phase comparators stops its operation to reduce power consumption.

6. The over-sampling type clock recovery circuit according to claim 3, wherein each of said selected phase comparators detects one of a clock leading state, a clock locking state and a clock delaying state to generate one of a clock leading state signal, a clock locking state signal and a clock delaying state signal, wherein a corresponding one of said plurality of active sets of clock signals leads said data signal in the clock leading state, the corresponding active set of clock signals matches to said data signal in phase in the clock locking state, and the corresponding active set of clock signals delays said data signal in phase in the clock delaying state, and wherein said majority determining circuit determines the majority of said clock leading state signals and said clock delaying state signals for said N phase comparators, and corrects one of said clock leading state signals and said clock delaying state signals on a minority side to match a corresponding one on a majority side to generate said plurality of phase difference data.

7. An over-sampling type clock recovery circuit according to claim 1, wherein the part of said N sets of clock signals is predetermined.

8. An over-sampling type clock recovery circuit according to claim 1, wherein said signal selecting section selects all of said N sets of clock signals when any one of said plurality of phase difference data indicates that said data signal and a corresponding one of said plurality of active sets of clock signals are not matched to each other in phase, and the part of said N sets of clock signals when all of the phase differences indicate that said data signal and a corresponding one of said plurality of active sets of clock signals are matched to each other in phase.

9. An over-sampling type clock recovery circuit according to claim 1, wherein said signal selecting section includes:
   a locking state detecting circuit for determining based on said plurality of phase difference data supplied from said phase difference detecting section whether said data signal and each of said plurality of active sets of clock signals are matched to each other in phase; and
   a switch circuit for supplying all of said N sets of clock signals to said phase difference detecting section as said plurality of active sets of clock signals when said locking state detecting circuit detects that said data signal and at least one of said plurality of active sets of clock signals are not matched to each other in phase.

10. An over-sampling type clock recovery circuit according to claim 9, wherein said switch circuit fixes said clock signals of as non-selected sets as ones of said N sets other than said selected sets to a high or low level, when said locking state detecting circuit detects that said data signal and each of said plurality of active sets of clock signals are not matched to each other in phase, and supplies said selected sets of clock signals and said non-selected sets of clock signals to said to said phase difference detecting section.

11. A method of adjusting phases of clock signals in an over-sampling type clock recovery circuit comprising the steps of:
   detecting a phase difference between a data signal and each of a plurality of active sets of clock signals, to generate a phase adjustment signal from a plurality of phase difference data corresponding to the detected phase differences using a majority determination;
   adjusting phases of clock signals of N (N is an integer equal to or larger than 2) sets based on said phase adjustment signal; and
   selecting a part or all of said N sets of clock signals as said plurality of active sets of clock signals based on said plurality of phase difference data from said phase difference detecting section.

12. A method according to claim 11, wherein said adjusting step includes:
   generating a reference clock signal;
   delaying said reference clock signal based on said phase adjustment signal;
   generating said N sets of clock signals from said delayed reference signal such that each of said plurality of clock signals has a predetermined delay; and
   adjusting phases of clock signals of said N sets based on said phase adjustment signal.

13. A method according to claim 11, wherein said detecting step includes:
   comparing a corresponding one of bits of said data signal and a corresponding one of said plurality of active sets of clock signals in phase to detect the phase difference;
   determining majority of said phase differences and changing ones of said phase differences on a minority side to match to ones of said phase differences on a majority side to generate said plurality of phase difference data; and
   generating said phase adjustment signal from said plurality of phase difference data.

14. A method according to claim 13, wherein said detecting step is performed by a phase difference detecting section, and
   wherein said selecting step includes selecting a part or all of said N sets of clock signals such that a portion of said phase difference detecting section to which said plurality of active sets of clock signals are not supplied does not operate.

15. A method according to claim 13, wherein said comparing step includes detecting one of a clock leading state, a clock locking state and a clock delaying state to generate one of a clock leading state signal, a clock locking state signal and a clock delaying state signal, wherein a corresponding one of said plurality of active sets of clock signals leads said data signal in the clock leading state, the corresponding active set of clock signals matches to said data signal in phase in the clock locking state, and the corresponding active set of clock signals delays than said data signal in phase in the clock delaying state; and
   wherein said determining step includes:
      determining the majority of said clock leading state signals and said clock delaying state signals for said N phase comparators; and
      correcting one of said clock leading state signals and said clock delaying state signals on a minority side to the other on a majority side to generate said plurality of phase difference data.

16. A method according to claim 11, wherein the part of said N sets of clock signals is predetermined.

17. A method according to claim 11, wherein said selecting step includes:
   selecting all of said N sets of clock signals when any one of said plurality of phase difference data indicates that said data signal and a corresponding one of said plurality of active sets of clock signals are not matched to each other in phase; and
   selecting the part of said N sets of clock signals when all of said plurality of phase difference data indicate that said data signal and a corresponding one of said plurality of active sets of clock signals are matched to each other in phase.

18. A method according to claim 11, wherein said selecting step includes:
   determining based on said plurality of phase difference data whether said data signal and each of said plurality of active sets of clock signals are matched to each other in phase; and
   selecting all of said N sets of clock signals as said plurality of active sets of clock signals when said plurality of phase difference data indicate that said data signal and at least one of said plurality of active sets of clock signals are not matched to each other in phase.

19. A method according to claim 18, wherein said selecting step includes:
   fixes said clock signals of as non-selected sets as ones of said N sets other than said selected sets to a high or low level, when said locking state detecting circuit detects that said data signal and each of said plurality of active sets of clock signals are not matched to each other in phase.

* * * * *